(12) United States Patent
Shimada et al.

(10) Patent No.: US 6,285,599 B1
(45) Date of Patent: Sep. 4, 2001

(54) DECODED SOURCE LINES TO TIGHTEN ERASE $V_T$ DISTRIBUTION

(75) Inventors: Hisayuki Shimada, San Jose; Wing Leung, Cupertino, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/562,747

(22) Filed: May 2, 2000

(51) Int. Cl.[7] ................................................ G11C 16/04
(52) U.S. Cl. .............................. 365/185.29; 365/185.22; 365/185.3
(58) Field of Search ........................... 365/185.29, 185.3, 365/185.24, 185.22, 185.23

(56) References Cited

U.S. PATENT DOCUMENTS

| 5,400,286 | * | 3/1995 | Chu et al. ............................. 365/218 |
| 5,546,340 | * | 8/1996 | Hu et al. ............................. 365/185.3 |
| 5,923,585 | * | 7/1999 | Wong et al. ....................... 365/185.03 |
| 5,991,206 | * | 11/1999 | Shin .................................. 365/185.29 |
| 5,995,418 | * | 11/1999 | Chen et al. ....................... 365/185.29 |

\* cited by examiner

Primary Examiner—Amir Zarabian
Assistant Examiner—Hien Nguyen
(74) Attorney, Agent, or Firm—H. Donald Nelson

(57) ABSTRACT

A flash memory device and a method to erase the flash memory device having a plurality of memory cells each having a source, a drain, a control gate, wherein the memory cells are organized in rows and columns with a wordline attached to the control gates of the memory cells in a row, with a bitline attached to the drains of cells in a column and a sourceline attached to the sources of cells in a row, and a switch connected between each sourceline and $V_S$ is controlled by sourceline decode circuit that opens a sourceline switch after the cells on the associated wordline verify as erased.

2 Claims, 6 Drawing Sheets

DECODED SOURCE LINES TO TIGHTEN ERASE $V_T$ DISTRIBUTION

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory (EEPROM) devices. Even more specifically, this invention relates to a method of erasing microelectronic flash Electrically Erasable Programmable Read-Only Memory devices that minimizes the number of erase pulses received by a given bit and tightens the erase threshold voltage distribution.

2. Discussion of the Related Art

A class of non-volatile memory devices known as "flash" EEPROM (Electrically Erasable Programmable Read Only Memory) devices combines the advantages of EPROM density with the electrical erasability of an EEPROM. One feature that distinguishes flash EEPROM memory cells from standard EEPROM memory cells is that unlike standard EEPROM memory cells, flash EEPROM memory cells do not contain a select transistor on a one-for-one basis with each floating gate memory cell. A select transistor is a transistor that allows the selection of an individual memory cell within the memory device and is used to selectively erase a specific memory cell. Because flash EEPROMs do not have a select transistor for each floating gate transistor, flash EEPROM memory cells cannot be individually erased and therefore must be erased in bulk, either by erasing the entire chip or by erasing paged groups or banks of cells. Elimination of the select transistor allows for smaller cell size and gives the flash EEPROM an advantage in terms of manufacturing yield (in terms of memory capacity) over comparably sized standard EEPROMs.

Typically, a plurality of flash EEPROM cells is formed on a semiconductor substrate, which is also known as a silicon wafer. FIG. 1A illustrates a single conventional flash EEPROM memory cell having a double-diffused source region. As shown in FIG. 1, flash memory cell 100 is formed on a p-type substrate 110 and includes an n type double-diffused source region 102 and an n+ drain region 104. The drain region 104 and the source region 102 are spaced apart from each other forming a channel $L_{CHANNEL}$ 122. A source electrode 114 and a drain electrode 112 are connected to the source region 102 and the drain region 104, respectively. A substrate electrode 105 is connected to the substrate 110.

The double-diffused source region 102 is formed of a lightly doped n region 128 (phosphorous doped) and a more heavily doped but shallower n+ region 130 (arsenic doped) embedded within the deep n region 128. The phosphorus doping within the n region 128 reduces the horizontal electric field between the source region 102 and the substrate 110.

The floating gate 106 is disposed a short distance above the source region 102, the drain region 104 and the channel $L_{CHANNEL}$ 122, over a dielectric layer 118, which is also known as a tunnel oxide region. Above the floating gate 106 and disposed over the dielectric layer 116 is a control gate 108. The dielectric layer 116 is typically formed of an oxide/nitride/oxide layer known in the semiconductor manufacturing art as an ONO layer. A control gate electrode 120 is attached to control gate 108. The dimension $L_{GATE}$ 132 represents the gate length for the gates contained in flash memory cell 100.

In a conventional method of operation, the programming of a flash EEPROM memory cell is achieved by inducing "hot electron" injection from a section of the channel 122 near the drain 104 into the floating gate 106. The injected electrons cause the floating gate 106 to carry a negative charge. Grounding the source region 102, biasing the control gate 108 to a relatively high positive voltage and biasing the drain region 104 to a moderate positive voltage induce the hot electrons.

For example, to program the flash memory cell 100 the source electrode 114 is connected to ground, the drain electrode 112 is connected to a relatively high voltage (typically+4 volts to +9 volts) and the control gate electrode 120 is connected to a relatively high voltage level (typically +8 volts to +12 volts). Electrons are accelerated from source region 102 to drain region 104 via the channel 122 and the "hot electrons" are generated near the drain region 104. Some of the hot electrons are injected through he relatively thin gate dielectric layer 118 and become trapped in the floating gate 106 thereby giving floating gate 106 a negative potential.

After sufficient negative charge accumulates on floating gate 106 the negative potential of floating gate 106 raises the threshold voltage of the stacked gate transistor and inhibits current flow through the channel 122 during a subsequent "read" mode. The magnitude of the read current is used to determine whether a memory cell has been programmed.

Conversely, to erase a flash memory device electrons are typically driven out of the floating gate 106 by biasing the control gate 108 to a large negative voltage and biasing the source region 102 to a low positive voltage in order to produce a sufficiently large vertical electric field in the tunnel oxide. The large vertical field in the tunnel oxide produces Fowler-Nordheim (F-N) tunneling of electrons stored in the floating gate 106 through the tunnel oxide into the source region 102. The charge removed from the floating gate 106 produces a threshold voltage shift.

For example, during erasure a relatively low positive voltage (typically from +0.5 volts to +5 volts) is applied to source electrode 114 and a relatively large negative voltage (typically from −7 volts to −13 volts) is applied to control gate electrode 120. The voltage of the substrate electrode 126 is grounded and the drain electrode 112 is allowed to float. The vertical electric fled established between the control gate 108 and the source region 102 induces electrons previously stored in floating gate 106 to pass through dielectric layer 118 and into source region 102 by way of Fowler-Nordheim tunneling.

In order to produce a sufficient electric field in the tunnel oxide, it is typically necessary to bias the control gate 108 to a large enough negative voltage such that the floating gate 106 reaches a voltage of approximately −5.5 volts. A typical potential difference $V_{SF}$ between the source region 102 and floating gate 106 is on the order of 10 volts and accordingly, when the source voltage $V_S$ is made less positive the control gate voltage $V_{CG}$ should be made more negative. Once the source to floating voltage $V_{SF}$ is selected, the remaining factors are preferably constrained according to the equation:

$$V_{FG} = \alpha_{CG}(V_{CG} - \Delta V_T) + \alpha_S V_S + \alpha_B V_B$$

where:
  $V_{FG}$=the floating gate voltage;
  $V_{CG}$=the control gate voltage;
  $V_S$=the source voltage;
  $V_B$=the substrate or p-well bias;
  $\Delta V_T$=the threshold voltage difference arising from negative charge added to the floating gate as measured from the control gate;

$\alpha_{CG}$=the capacitive coupling coefficient from the control gate to the floating gate;

$\alpha_S$=the capacitive coupling coefficient between the source and the floating gate;

$\alpha_B$=the capacitive coupling coefficient between the substrate or p-well and the floating gate.

Programming operations on a flash memory cell involve the application of a relatively large constant voltage to the drain of the flash memory cell while an even larger voltage is applied to the control gate. During such a programming operation, the source of the flash memory cell is maintained at a ground level or a zero voltage level in relation to the voltages applied to the control gate and drain.

Such a relatively high voltage potential applied between the drain and source causes electrons to flow through the channel region from the source to the drain. The electrons flowing between the source and drain can attain relatively high kinetic energy levels near the drain. In addition, the high constant voltage applied to the control gate raises the voltage potential of the floating gate to a high level at the start of the programming operation. Such a high voltage potential on the floating gate usually attracts the electrons flowing through the channel region. Under these conditions, electrons in the channel region having sufficiently high kinetic energy migrate through the tunnel oxide layer and onto the floating gate. This phenomenon is commonly referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of a flash memory cell to cause conduction through the channel region during a read operation on the flash memory cell. The time involved in a programming operation depends upon the rate at which electrons are injected onto the floating gate. As can be appreciated, the slower the rate of injection the longer the programming time to reach the desired threshold voltage.

With such programming techniques, the relatively high voltage potential of the floating gate at the start of the programming operation is reduced as electrons accumulate on the floating gate. Such a reduction in the voltage potential of the floating gate causes a corresponding reduction in the rate of electron injection onto the floating gate. Such a reduction in the rate of electron injection increases the time required to program a flash memory cell to the desired threshold voltage. Such increased programming time slows the overall speed of flash memory devices that employ such programming techniques.

In addition, it is well known that a hot carrier programming technique results in the formation of electron-hole pairs in the channel region of the flash memory cell near the drain. The electron-hole pairs are formed when high-energy electrons bombard the crystal lattice structure of the silicon substrate and dislodge other electrons from the lattice. Moreover, the portions of the channel region near the drain usually have a relatively high voltage potential due to the high voltage applied to the drain. As a consequence, the voltage potential of the floating gate can fall below the voltage potential of the portion of the channel region located near the drain as the voltage level on the floating gate decreases during programming. Under this condition, holes from the electron-hole pairs that are created in the channel region near the drain can migrate throughout the tunnel oxide layer and onto the floating gate. Such migration of holes onto the floating gate causes surface damage to the tunnel oxide layer. Such surface damage usually causes long-term reliability problems in the flash memory cell by reducing the rate of injection of electrons onto the floating gate during programming. In addition, such surface damage can interfere with current flow through the channel region of the flash memory cell during a read operation that also results in a reduction in long-term reliability.

The microelectronic flash or block-erase Electrically Erasable Programmable Read-Only Memory (Flash EEPROM) includes an array of cells that can be independently programmed and read. The size of each cell and thereby the memory are made small by omitting transistors known as select transistors that would enable the cells to be erased independently. As a result, all of the cells must be erased together as a block.

A flash memory device of this type includes individual Metal-Oxide-Semiconductor (MOS) field effect transistor (FET) memory cells. Each of the FETs includes a source, a drain, a floating gate and a control gate to which various voltages are applied to program the cell with a binary 1 or 0, to read the cells, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying programming voltages as follows: a voltage, typically in the range of 9–10 volts to the control gate, a voltage of approximately 5 volts to the drain and grounding the source. As discussed above, these voltages cause hot electrons to be injected from a drain depletion region into the floating gate. Upon removal of the programming voltages, the injected electrons are trapped in the floating gate and create a negative change therein that increases the threshold voltage of the cell to a value in excess of approximately 4 volts.

A cell is read by applying a voltage of about 5 volts to the control gate, applying about 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of minus 10 volts to the control gate, applying 5 volts to the source and allowing the drain to float can also erase a cell. Another method of erasing a cell is by applying 5 volts to the P-well and minus 10 volts to the control gate while allowing the source and drain to float.

A problem with conventional flash EEPROM cells is that because of manufacturing tolerances, some cells become over-erased before other cells become sufficiently erased. The floating gates of the over-erased cells are either completely or partially depleted of electrons and have a very low negative charge or become positively charged. The over-erased cells can function as depletion mode transistors that cannot be turned off by normal operating voltages applied to their control gates and introduce leakage current to the bit line during subsequent program and read operations. The slightly overerased cells can introduce varying amounts of leakage current to the bitline depending upon the extent of overerasure.

More specifically, during program and read operations only one wordline is held high at a time, while the other wordlines are grounded. However, because a positive voltage is applied to the drains of all of the cells and if the threshold voltage of an unselected cell is very low, zero or negative, a leakage current will flow through the source, channel and drain of the cell.

The undesirable effect of leakage current is illustrated in FIG. 2B, which is a simplified electrical schematic diagram of a column 202 of flash EEPROM cells 204, 206, 208 and 210. The sources of the column 202 of transistors are all connected to a source supply voltage $V_S$. A programming voltage $V_{CG}$ is applied to the control gate of the transistor 206, which turns it on. A current $I_2$ flows through the transistor 206 from ground through its source, channel (not shown) and drain. Ideally, the bitline current $I_{BL}$ is equal to $I_2$. However, if one or more of the unselected transistors, for example transistors 204, 208 or 210 as illustrated in FIG. 2C, are overerased or slightly overerased, their threshold voltages will be very low, zero or even negative, and background leakage currents $I_1$, $I_3$, and $I_4$ could flow through the transistors 204, 208, and 210, respectively. The bitline current $I^{BL}$ would then be equal to the sum of $I_2$ and the background leakage currents $I_1$, $I_3$ and $I_4$. In a typical flash EEPROM, the drains of a large number of memory transistor cells, for example 512 transistor cells are connected to each bitline. If a substantial number of cells on the bitline are drawing background leakage current, the total leakage current on the bitline can exceed the cell read current. This makes it impossible to read the state of any cell on the bitline and therefore renders the memory inoperative.

It is known in the art to reduce the threshold voltage distribution by performing an over-erase correction operation, which reprograms the most over-erased cells to a higher threshold voltage. An over-erase correction operation of this type is generally known as Automatic Programming Disturb (APD).

A preferred APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland. This patent is assigned to the same assignee as the present invention and is incorporated herein by reference in its entirety. The method includes sensing for over-erased cells and applying programming pulses thereto, which bring their threshold voltages back up to acceptable values.

Following application of an erase pulse, under-erase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current and thereby determine if the threshold voltage of the cell is above a value of, for example, 2 volts. If the cell is under-erased, indicated by a threshold voltage above 2 volts, the bitline current will be low. In this case, an erase pulse is applied to all of the cells, and the first cell is erase verified again.

After application of each erase pulse and prior to a subsequent erase verify operation, over-erase correction is performed on all of the cells of the memory. Over-erase verify is performed on the bitlines of the array in sequence. Grounding the wordlines, applying typically 1 volt to the first bitline and sensing the bitline current accomplish this. If the current is above a predetermined value, this indicates that at least one of the cells connected to the bitline is over-erased and is drawing leakage current. In this case, an over-erase correction pulse is applied to the bitline. This is accomplished by applying approximately 5 volts to the bitline for a predetermined length of time such as 100 μs.

After application of the over-erase correction pulse the bitline is verified again. If bitline current is still high indicating that an over-erased cell still remains connected to the bitline, another over-erase correction pulse is applied. This procedure is repeated for all of the bitlines in sequence.

The procedure is repeated, as many times as necessary until the bitline current is reduced to the predetermined value, which is lower than the read current. Then, the procedure is performed for the rest of the cells in the first row and following rows until all of the cells in the memory have been erase verified.

By performing the over-erase correction procedure after each erase pulse, the extent to which cells are over-erased is reduced, improving the endurance of cells. Further, because over-erased cells are corrected after each erase pulse, bitline leakage current is reduced during erase verify, thus preventing under-erased cells from existing upon completion of the erase verify procedure.

FIG. 2C illustrates how the threshold voltages of the cells or bits in a flash EEPROM can differ following an erase operation as shown by curve 212 that represents the number of cells having particular values of threshold voltage $V_T$. It will be seen that the least erased cells will have relatively high threshold voltages in the region of $V_T$MAX, whereas the most overerased cells will have low threshold voltages in the region of $V_T$MIN that can be zero or negative. The characteristic curve illustrated in FIG. 2C is known as the threshold voltage distribution. The dashed portion 214 of the curve 212 shows the threshold voltages of the cells in a flash EEPROM after the overerase correction operation. It is noted that correcting the $V_T$ of the most overerased cells has changed the threshold voltage distribution. However, the threshold voltage distribution curve 212 indicates that there are a number of cells that still have a very low threshold voltage.

Because the background leakage current of a cell varies as a function of threshold voltage, the lower (more negative) the threshold voltage the higher the leakage current. Because there may be as many as 512 cells connected to a bitline, the background leakage current may still be sufficient to exceed the cell read current. It is therefore desirable to prevent cells from not only being over-erased but to reduce the threshold voltage distribution to as low a range as possible, with ideally all cells having the same high threshold voltage after erase on the order of 2 volts.

Therefore, what is needed is a flash memory device and a method of erasing the device that reduces column leakage and tightens the $V_t$ distribution curve.

SUMMARY OF THE INVENTION

According to the present invention, the foregoing and other objects and advantages are obtained by a flash memory device and method of erasing the flash memory device that decreases the $V_t$ threshold voltage distribution and reduces column leakage.

In accordance with a first aspect of the present invention, the flash memory device has a plurality of memory cells each having a source, a drain, and a control gate. The plurality of memory cells are organized in rows and columns with a wordline attached to the control gates of the memory cells in a row, with a bitline attached to the drains of cells in a column and a sourceline attached to the sources of cells in a row and a sourceline switch connected between each sourceline and $V_S$. The sourceline switch is controlled by a sourceline decode circuit.

In accordance with another aspect of the present invention, the sourceline decode circuit opens the sourceline after the bits on the associated wordline verify as erased.

In accordance with another aspect of the present invention, after an erase pulse is applied to the flash memory device an APDEV and APD procedure is conducted on each subsequent wordline and repeated until each bit on the wordline verify as erased. When each bit on the wordline verify as erased, the sourceline switch is opened and an APDEV and APD procedure is conducted on the next wordline until all bits on all wordlines verify as erased.

The described method thus provides a flash memory device and a method of erasing the flash memory device that tightens the threshold voltage distribution of the cells in the flash memory device.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
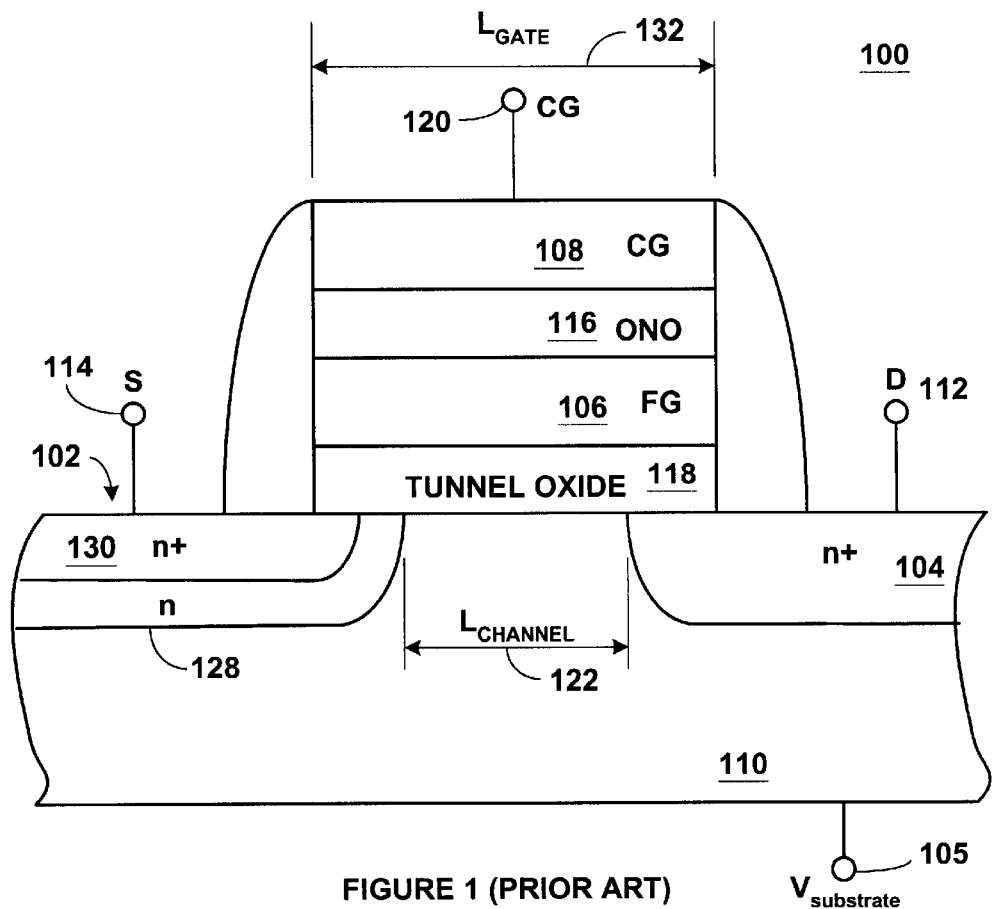
FIG. 1 shows the architecture of a typical flash memory cell with a double diffused source region.
Figure 2A:
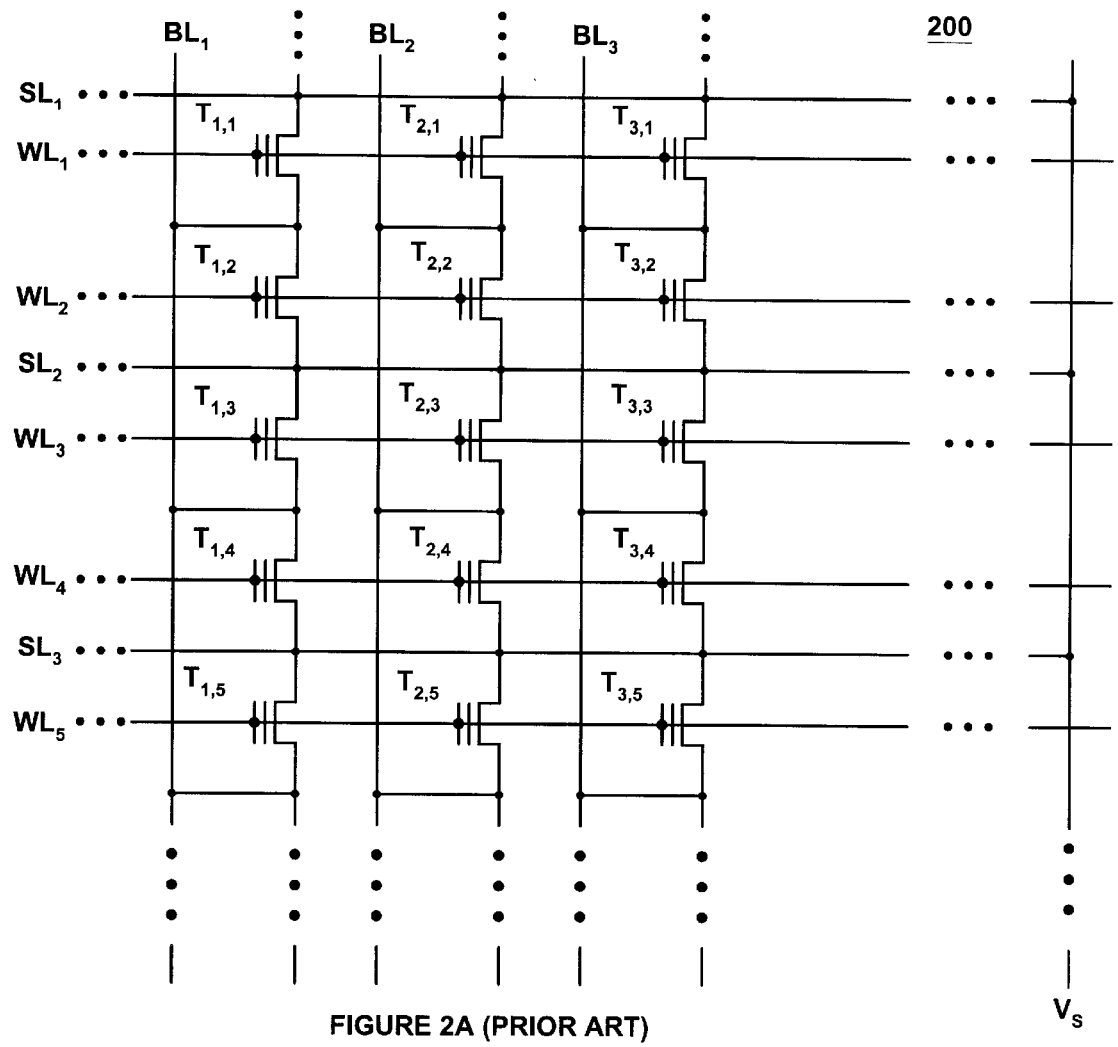
FIG. 2A shows the architecture of a portion of a typical flash memory device.
Figure 2B:
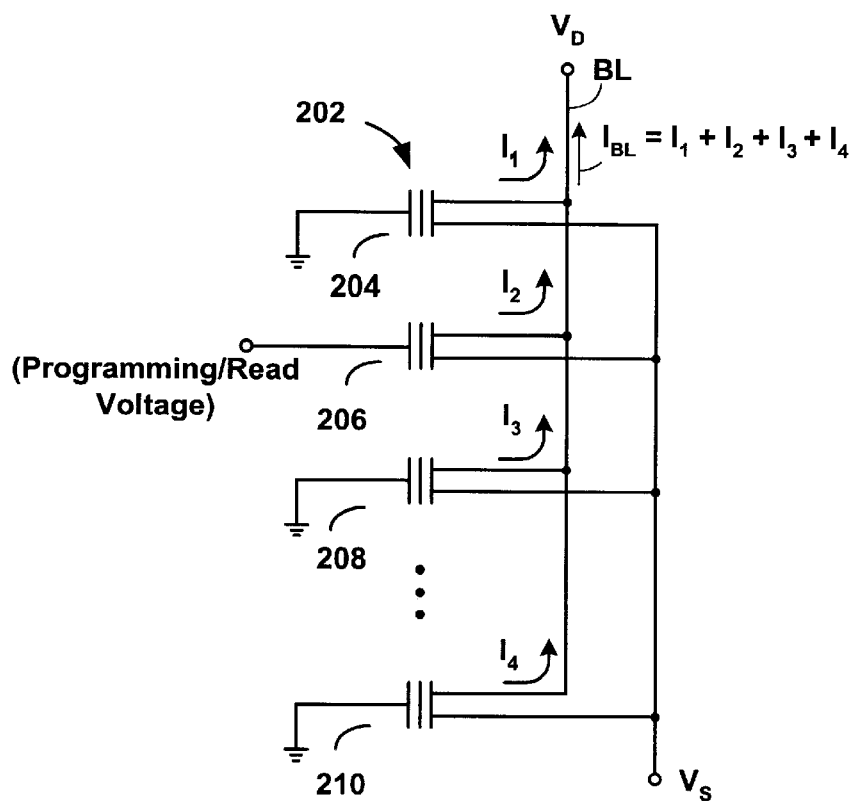
FIG. 2B is a simplified electrical schematic diagram of a column of flash EEPROM cells illustrating the undesirable effect of leakage current.
Figure 2C:
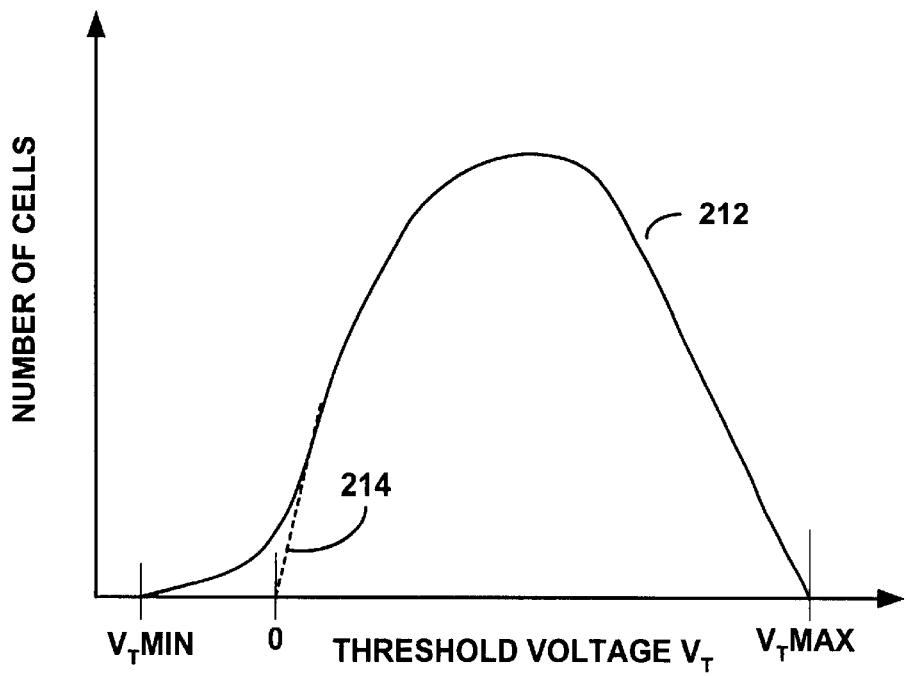
FIG. 2C is a graph illustrating the threshold voltage distribution after an erase operation of the flash memory device shown in FIG. 2A.

FIG. 2A shows the basic configuration of a portion 200 of a NOR type flash Electrically Erasable Programmable Read-Only Memory (EEPROM) of a typical flash memory device. The portion 200 of the flash memory device comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver (not shown) applies appropriate voltages to the bitlines and a wordline driver (not shown) applies appropriate voltages to the wordlines.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 2A are designated using the notation $T_{n,m}$, where m is the row (wordline) and n is the column (bitline). The control gates of the cells are connected to respective wordlines and the drains of the cells are connected to respective bitlines as illustrated. The sources of all of the cells are connected to the common terminal at $V_S$.

Figure 3A:
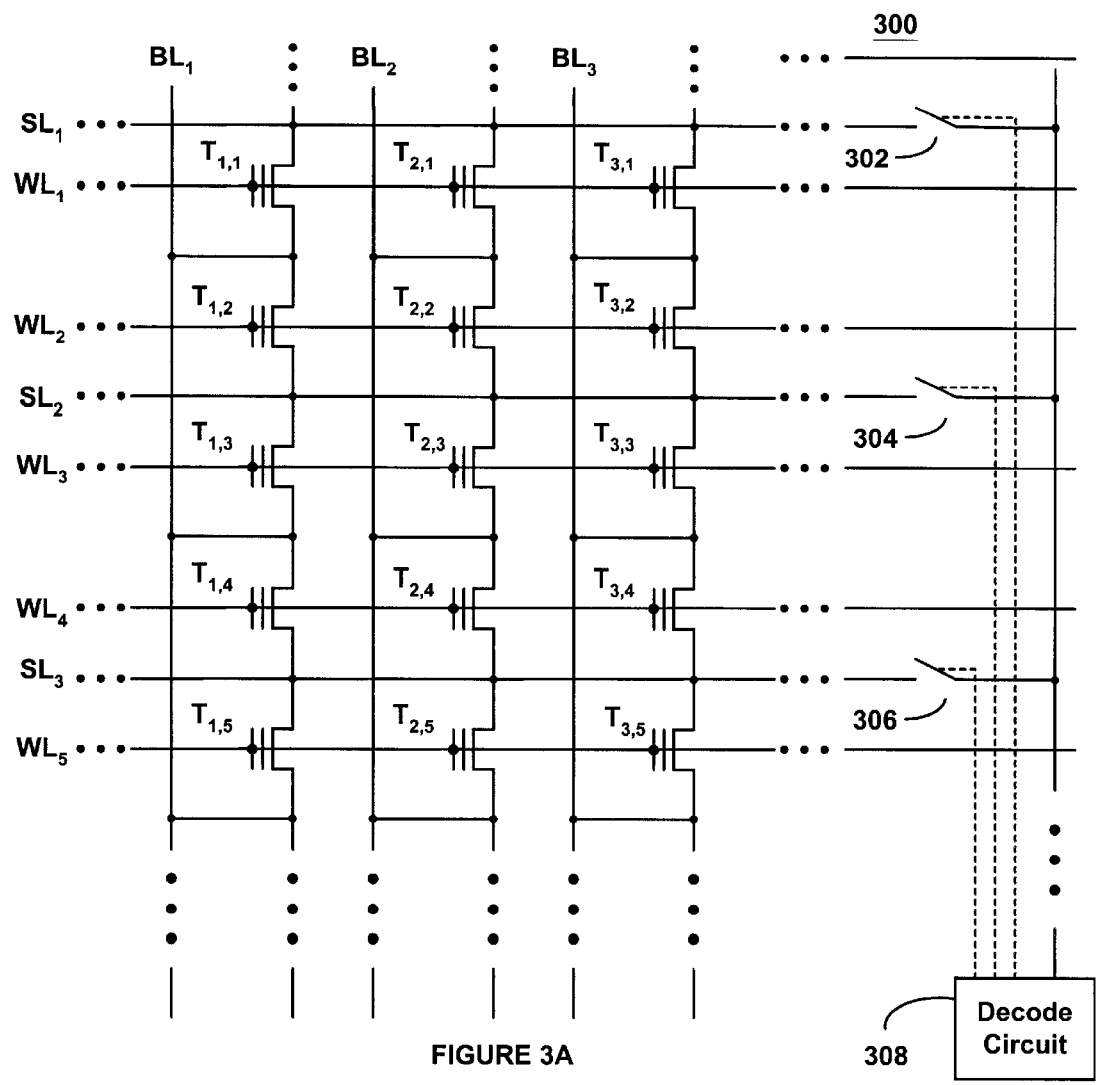
FIG. 3A shows the architecture of a portion of a flash memory device in accordance with the present invention.

FIG. 3A shows the basic configuration of a portion 300 of a NOR type flash Electrically Erasable Programmable Read-Only Memory (EEPROM) of a flash memory device in accordance with the present invention. The portion 300 of the flash memory device comprises a plurality of core or memory cells, which are arranged in a rectangular matrix of rows and columns. Each row is associated with a wordline (WL), whereas each column is associated with a bitline (BL).

Similar to the prior art device shown in FIG. 2A, assuming there are n columns and m rows, the bitlines are designated as $BL_0$ to $BL_n$ and the wordlines are designated as $WL_0$ to $WL_m$. A bitline driver (not shown) applies appropriate voltages to the bitlines and a wordline driver (not shown) applies appropriate voltages to the wordlines.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 3A are designated using the notation $T_{n,m}$ where m is the row (wordline) and n is the column (bitline). The control gates of the memory cells in a row are connected to a wordline. The drains of the memory cells in a column are connected to a bitline as illustrated. The sources of the memory cells in a wordline are connected to a source line switch. Accordingly, $SL_1$ is connected to source line switch 302, $SL_2$ is connected to source line switch 304 and $SL_3$ is connected to source line switch 306. Source line switches 302, 304 and 306 are controlled by decode circuit 308. As will be discussed below, after bits on a wordline are verified as properly erased (not overerased or undererased), the decode circuit 308 opens the sourceline associated with the wordline on which bits were just verified as properly erased. This prevents the wordline just verified as being properly erased from being affected as subsequent wordlines are erase verified. For example, during an erase operation, after the bits attached to $WL_1$ are subjected to APDEV (Automatic Programming Disturb Erase Verify) and APD (Automatic Programming Disturb) and are verified as being properly erased, the decode circuit 308 opens switch 302 and the bits on $WL_2$ are then subjected to APDEV and APD. This repeats until all the bits on all the wordlines are erase verified.

Figure 3B:
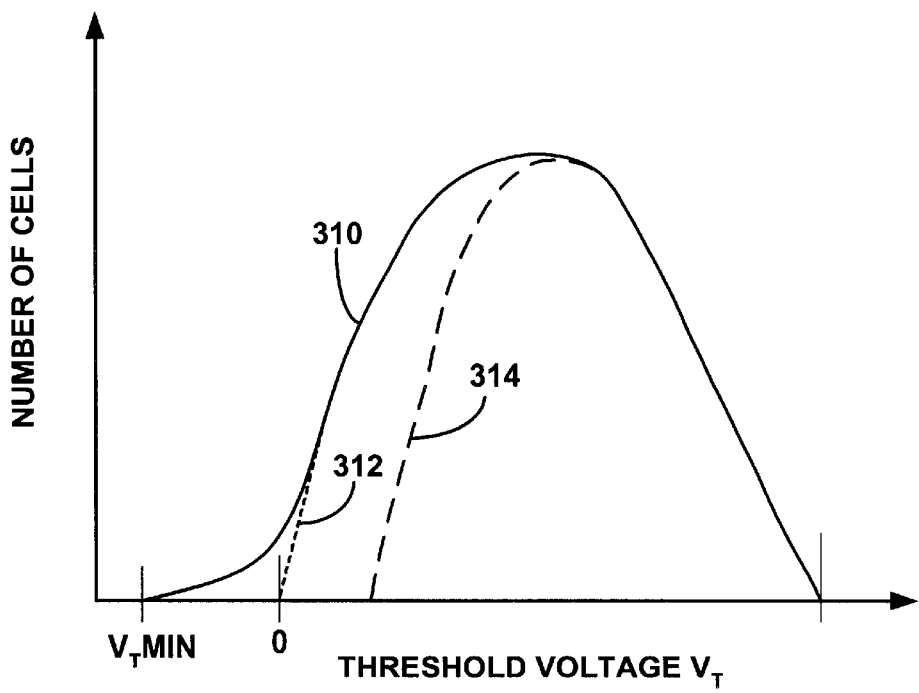
FIG. 3B is a graph illustrating the threshold voltage distribution after an erase operation of the flash memory device shown in FIG. 3A.

FIG. 3B illustrates the narrowing of the threshold voltage $V_T$ versus the number of cells. The solid curve 310 represents the threshold voltage distribution of cells after an erase operation, the dashed portion 312 indicates how overerase correction corrects the most overerased cells and is typically successful in increasing the threshold voltage of the most overerase cells above zero. The dashed line 314 is the voltage threshold distribution of memory cells after the method in accordance with the present invention.

Figure 4:
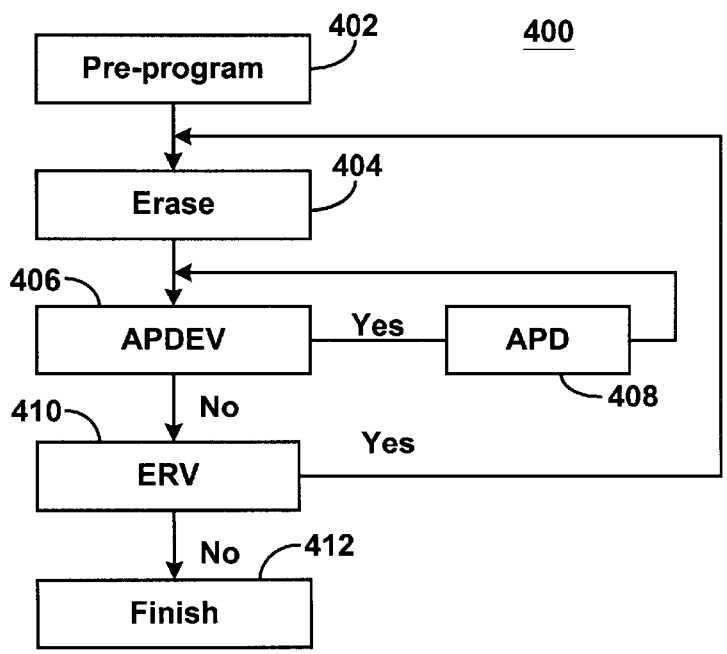
FIG. 4 is the flow diagram of a typical prior art erase method.

FIG. 4 is a flow diagram of a prior art erase method 400. The prior art erase method 400 begins by a pre-programming step 402 in which all the cells in the memory device or in the bank to be erased are programmed to approximately the same charge level. The purpose of this is to avoid having some cells that were either not programmed or that may have lost charge during normal operations to be substantially overerased during the erase procedure. It should be remembered that all the cells either in a bank or in the entire device are erased as a block and therefore all cells would receive the same erase pulse regardless of their individual charge state. All of the cells that are to be erased are given an erase pulse at 404. As discussed above, a cell can be erased in several ways. In one arrangement, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. In another arrangement, applying a negative voltage on the order of minus 10 volts to the control gate, applying 5 volts to the source and allowing the drain to float can also erase a cell. In a farther arrangement, applying 5 volts to the P-well and minus 10 volts to the control gate while allowing the source and drain to float erases a cell.

After the erase pulse is applied at 204 an over-erase correction operation is performed starting with an over-erase verification (APDEV) step at 406. The over-erase correction operation is necessary because manufacturing tolerances cause some cells to become over-erased before other cells become erased sufficiently. The overerased cells function as depletion mode transistors that cannot be turned off by normal operating voltages applied to their control gates. The overerased cells functioning as depletion mode transistors introduce leakage current during subsequent program and read operations. The over-erase verification step at 406 determines if an overerase correction operation is required. If an over-erase correction pulse is needed, it is applied at 408. The over-erase correction pulse is approximately 5 volts applied to the bitline to which the overerased cell is attached for a predetermined length of time such as 100 μs. As can be appreciated, the over-erase correction pulse is applied to all the cells attached to the bitline. The over-erase correction operation of this type is generally known as Automatic Programming Disturb (APD). As discussed above, a method of APD is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland.

After the cells have subjected to an APD pulse at 408 the cells are again over-erase verified at 406 and this cycle repeats until it is verified at 406 that there are no over-erased cells. This cycle repeats bitline by bitline until it is verified at 406 that there are no over-erased cells in the array being erased wherein the cells are erase verified at 410 to determine if there are undererased cells. Determining if there are undererased cells can be accomplished by applying 4 volts to the control gate (wordline), 1 volt to the drain (bitline), grounding the source and using sense amplifiers to sense the bitline current and thereby determine if the threshold voltage of the cell is above a predetermined value. If the threshold voltage of the cell is above the predetermined value, the cell is undererased. If it is determined at 410 that there are undererased cells an erase pulse is applied at 204 to the entire memory array and steps from 406 through 410 are repeated until it is verified at 410 there are no undererased cells at which time the erase procedure is considered finished as indicated at 412. As can be appreciated, the repeated application of the full potential difference to all the bits as erase pulses are applied increases the $V_t$ threshold distribution as discussed above.

Figure 5:
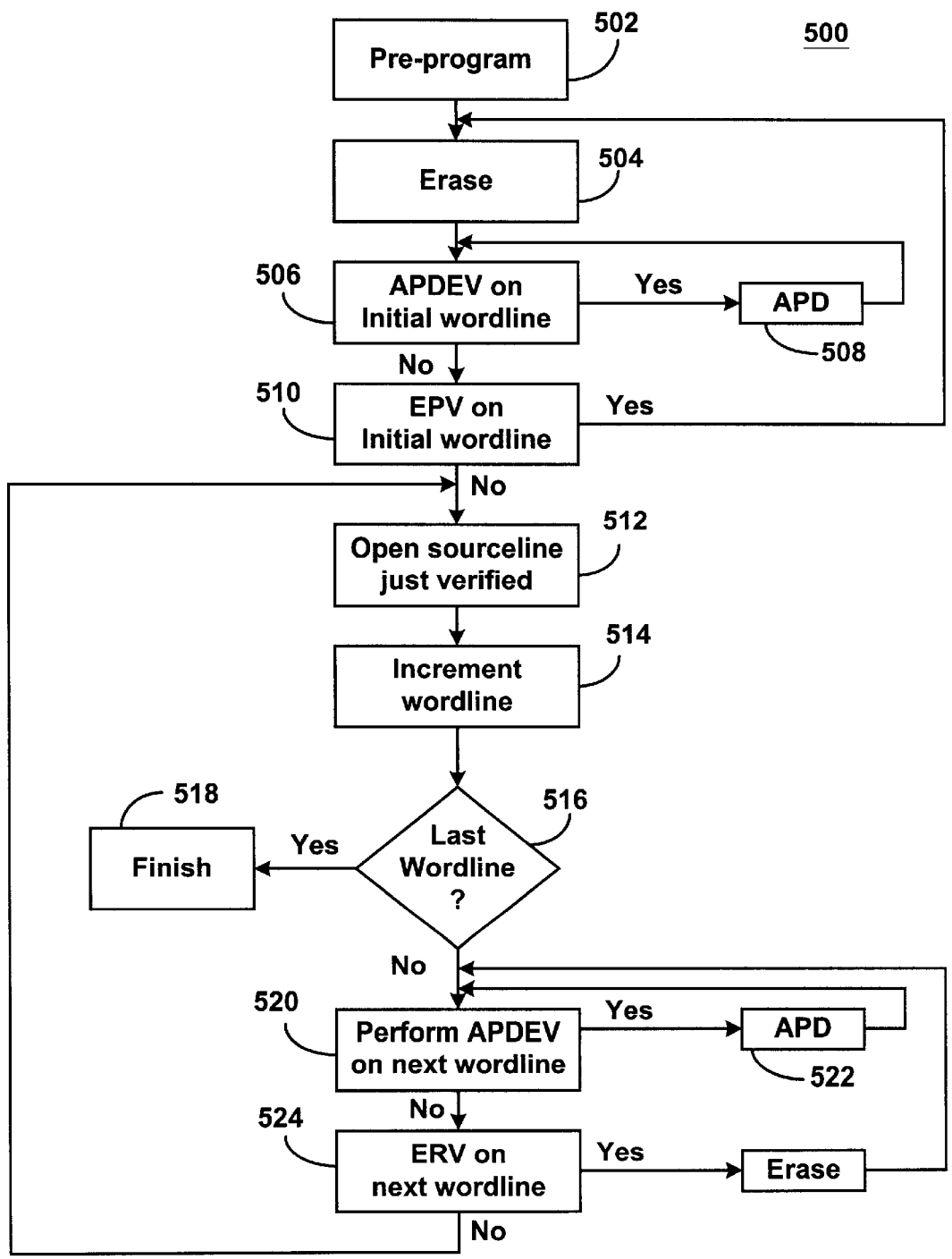
FIG. 5 is the flow diagram of the erase method in accordance with the present invention.

FIG. 5 is a flow diagram of an erase method 500 in accordance with the present invention. The erase method 500 begins by a pre-programming step 502 in which all the cells in the memory device or in the bank to be erased are programmed to approximately the same charge level. The purpose of this is to avoid having some cells that were either not programmed or that may have lost charge during normal operations to be substantially overerased during the erase procedure. It should be remembered that all the cells either in a bank or in the entire device are erased as a block and therefore all cells would receive the same erase pulse regardless of their individual charge state. All of the cells that are to be erased are given an erase pulse at 504. As discussed above, a cell can be erased in several ways. In one arrangement, applying a relatively high voltage, typically 12 volts to the source, grounding the control gate and allowing the drain to float will erase a cell. This causes the electrons that were injected into the floating gate during the programming to undergo Fowler-Nordheim tunneling from the floating gate through the thin tunnel oxide layer to the source. In another arrangement, applying 5 volts to the source and allowing the drain to float can also erase a cell. In a farther arrangement, applying 5 volts to the P-well and minus 10 volts to the control gate while allowing the source and drain to flat erases a cell.

After the erase pulse is applied at 504, an over-erase correction operation is performed on bits attached to an initial wordline as indicated at 506. The over-erase correction operation is necessary because manufacturing tolerances cause some cells to become over-erased before other cell become sufficiently erased. The overerase cells function as depletion mode transistors that cannot be turned off by normal operating voltages applied to their control gates. The overerased cells functioning as depletion mode transistors introduce leakage current during subsequent program and read operations. The over-erase verification step at 506 determines if an overerase correction operation is required. If an over-erase correction pulse is needed, it is applied at

508. The over-erase correction pulse is approximately 5 volts applied to the bitline to which the overerased cell is attached for a predetermined length of time such as 100 μs. As can be appreciated, the over-erase correction pulse is applied to all the cells attached to the bitline. The over-erase correction operation of this type is generally known as Automatic Programming Disturb (APD). As discussed above, a method of APD is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS," issued Jun. 24, 1997 to Lee Cleveland.

After the cells have been subjected to an APD pulse at 508, the cells are again over-erase verified at 506 and this cycle repeats until it is verified at 506 that there are no over-erased cells. This cycle repeats bitline by bitline until it is verified at 506 that there are no over-erased cells on the initial wordline being erased wherein the cells are erase verified at 510 to determined if there are undererased cells. Determining if there are undererased cells can be accomplished by applying 4 volts to the control gate (wordline), 1 volt to the drain (bitline), grounding the source and using sense amplifiers to sense the bitline current and thereby determine if the threshold voltage of the cell is above a predetermined value. If the threshold voltage of the cell is above the predetermined value, the cell is undererased. If it is determined at 510 that there are undererased cells, an erase pulse is applied at 504 to the entire memory array and steps from 506 through 510 are repeated until it is verified at 510 that there are no undererased cells. If there are no undererased cells (bits), the sourceline attached to the bits just verified on the wordline is opened at 512 and the wordline to be subjected to APDEV and APD is incremented at 514.

It is determined at 516 if the wordline just verified is the last wordline. If the wordline just verified is the last wordline, the erase procedure for the memory array device is considered finished as indicated at 518. If the wordline just verified is not the last wordline, the APDEV, APD and ERV operations as describe above are conducted as indicated at 520, 522 and 524.

In summary, the present invention overcomes the limitations of the prior art and fulfills the need for a flash memory device and a method to erase the flash memory device that avoids the unnecessary application of APD pulses to cells that have verified as properly erased.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of erasing a flash Electrically-Erasable Programmable Read Only Memory (EEPROM) that includes a plurality of memory cells each having a source, a drain, a control gate, wherein the memory cells are organized in rows and columns with a wordline attached to the control gates of cells in a row, with a bitline attached to the drains of cells in a column and a source line attached to the sources of cells in a row, wherein each sourceline is attached to a switch connected to a voltage ($V_S$ and controlled by a source line decoder; the method comprising:

(a) applying an erase pulse to the plurality of memory cells;

(b) conducting Automatic Programming Disturb Erase Verify (APDEV) and Automatic Programming Disturb (APD) on bits attached to an initial wordline;

(c) repeating step (b) until all bits attached to the initial wordline verify as erased;

(d) opening the switch attached to the sourceline of the bits in the wordline just verified as erased;

(e) conducting Automatic Programming Disturb Erase Verify (APDEV) and Automatic Programming Disturb (APD) on bits attached to a next wordline;

(f) repeating step (e) until all bits attached to the next wordline verify as erased;

(g) determine if the wordline just verified is the last wordline; and (h) repeating steps (d) through (g) until all wordlines verify as erased.

2. The method of claim 1 wherein step (d) is accomplished by a decode circuit controlling the state of each switch attached to each sourceline.

\* \* \* \* \*